United States Patent
Albinali

(10) Patent No.: US 11,680,465 B2
(45) Date of Patent: Jun. 20, 2023

(54) SYSTEMS AND METHODS FOR MULTISCALE SECTOR HYDROCARBON RESERVOIR SIMULATION

(71) Applicant: Saudi Arabian Oil Company, Dhahran (SA)

(72) Inventor: Ali Abdulrahman Albinali, Doha (SA)

(73) Assignee: Saudi Arabian Oil Company, Dhahran (SA)

( * ) Notice: Subject to any disclaimer, the term of this patent is extended or adjusted under 35 U.S.C. 154(b) by 655 days.

(21) Appl. No.: 16/725,115

(22) Filed: Dec. 23, 2019

(65) Prior Publication Data

US 2021/0189840 A1   Jun. 24, 2021

(51) Int. Cl.
| | |
|---|---|
| *E21B 41/00* | (2006.01) |
| *G06F 30/28* | (2020.01) |
| *E21B 49/08* | (2006.01) |
| *G01V 99/00* | (2009.01) |
| *E21B 43/00* | (2006.01) |

(52) U.S. Cl.
CPC .......... *E21B 41/0092* (2013.01); *E21B 49/08* (2013.01); *G01V 99/005* (2013.01); *G06F 30/28* (2020.01); *E21B 43/00* (2013.01); *E21B 2200/20* (2020.05); *G01V 2210/663* (2013.01)

(58) Field of Classification Search
CPC ............ G01V 99/005; G01V 2210/663; G06F 30/28; E21B 43/00; E21B 2200/20; E21B 41/0092; E21B 49/08; E21B 41/00
See application file for complete search history.

(56) References Cited

U.S. PATENT DOCUMENTS

| | | | |
|---|---|---|---|
| 6,662,146 B1 | 12/2003 | Watts | |
| 7,805,283 B2 | 9/2010 | Zangl et al. | |
| 8,718,992 B2 | 5/2014 | Verscheure | |
| 9,187,984 B2 | 11/2015 | Usadi et al. | |
| 9,260,948 B2 | 2/2016 | Maucec et al. | |
| 9,703,006 B2 | 7/2017 | Stern et al. | |
| 2007/0061117 A1* | 3/2007 | Landis | E21B 49/00 703/10 |
| 2008/0319726 A1* | 12/2008 | Berge | E21B 41/0064 703/10 |
| 2013/0118736 A1* | 5/2013 | Usadi | E21B 41/00 166/268 |

(Continued)

FOREIGN PATENT DOCUMENTS

| | | |
|---|---|---|
| WO | 2012015521 A1 | 2/2012 |
| WO | 2018005214 A1 | 1/2018 |

OTHER PUBLICATIONS

Chen, Yan, and Dean S. Oliver. "History Matching of the Norne Full-Field Model With an Iterative Ensemble Smoother." SPE Res Eval & Eng 17 (2014): 244-256. doi: https://doi.org/10.2118/164902-PA. (Year: 2014).*

(Continued)

*Primary Examiner* — Eunhee Kim
(74) *Attorney, Agent, or Firm* — Bracewell LLP; Constance G. Rhebergen; Brian H. Tompkins

(57) ABSTRACT

Systems and methods for multiscale sectors based hydrocarbon reservoir simulation that include dividing a full-field reservoir model into regions and sub-regions, and iteratively assessing and reconnecting models of the sub-regions and regions in a sequential manner to generate an adjusted full-field model.

24 Claims, 5 Drawing Sheets

(56) References Cited

U.S. PATENT DOCUMENTS

| | | | | |
|---|---|---|---|---|
| 2013/0211800 A1* | 8/2013 | Fung | .................. | G06F 30/20 |
| | | | | 703/2 |
| 2014/0257706 A1* | 9/2014 | Biterge | .................. | G01V 1/40 |
| | | | | 702/13 |
| 2016/0004800 A1 | 1/2016 | Singh et al. | | |
| 2016/0061008 A1* | 3/2016 | Al-Turki | .................. | G06F 9/485 |
| | | | | 703/10 |
| 2017/0131434 A1 | 5/2017 | Bergey et al. | | |

OTHER PUBLICATIONS

Lin, Binghuai, Crumpton, Paul I, and Ali H. Dogru. "Field-Scale Assisted History Matching Using A Systematic, Massively Parallel Ensemble Kalman Smoother Procedure." Paper presented at the SPE Reservoir Simulation Conference, Montgomery, Texas, USA, Feb. 2017. (Year: 2017).*

Aadland, Atle, and Adolfo Henriquez. "New Field Simulation Strategy With Detailed Element Models and Flux Boundary Conditions: Statfjord Field Case Study." Paper presented at the European Petroleum Computer Conference, Stavanger, Norway, May 1992. (Year: 1992).*

International Search Report and Written Opinion for International Application No. PCT/US2020/066953 (SA51292) report dated Apr. 21, 2021; pp. 1-18.

Schulze-Riegert, R.W. et al.; "Evolutionary Algorithms Applied to History Matching of Complex Reservoirs" SPE 77301, Apr. 2002 SPE Reservoir Evaluation & Engineering; pp. 163-173.

Davolio, Alessandra et al.; "Local History Matching Using 4D Seismic Data and Multiple Models Combination" SPE 164883-MS, EA GE Annual Conference & Exhibition, London, UK, Jun. 10-13, 2013; pp. 1-10.

\* cited by examiner

SYSTEMS AND METHODS FOR MULTISCALE SECTOR HYDROCARBON RESERVOIR SIMULATION

FIELD

Embodiments relate generally to developing hydrocarbon reservoirs, and more particularly to hydrocarbon reservoir simulation.

BACKGROUND

A rock formation that resides under the Earth's surface is often referred to as a "subsurface" formation. A subsurface formation that contains a subsurface pool of hydrocarbons, such as oil and gas, is often referred to as a "hydrocarbon reservoir." Hydrocarbons are typically extracted (or "produced") from a hydrocarbon reservoir by way of a hydrocarbon well. A hydrocarbon well normally includes a wellbore (or "borehole") that is drilled into the reservoir. For example, a hydrocarbon well may include a wellbore that extends into the rock of a reservoir to facilitate the extraction (or "production") of hydrocarbons from the reservoir, the injection of fluids into the reservoir, or the evaluation and monitoring of the reservoir.

Development of a hydrocarbon reservoir typically involves multiple phases and operations directed to optimizing extraction of the hydrocarbons from the reservoir. For example, a reservoir operator may spend a great deal of time and effort assessing a hydrocarbon reservoir to identify an economical and environmentally responsible plan to extract hydrocarbons from the reservoir, and may engage in corresponding well drilling and production operations to extract hydrocarbons from the reservoir in accordance with the plan. This can include identifying where hydrocarbons are located in the reservoir and generating a field development plan (FDP) that outlines procedures for extracting hydrocarbons from the reservoir, and drilling and operating multiple wells in accordance with the procedures of the FDP. An FDP for a hydrocarbon reservoir may, for example, specify locations, trajectories and operational parameters of production wells, injection wells and monitoring wells that extend into the reservoir.

In many instances, operators rely on simulations to characterize a hydrocarbon reservoir, and the results of the simulations are used as a basis for developing the reservoir. For example, an operator may generate simulations of hydrocarbon reservoir operational scenarios to predict how fluids, such as water and hydrocarbons, will move within the reservoir and to predict a volume of hydrocarbon production from the reservoir. The operator may, in turn, use the results of the simulations to generate or update FDPs for the reservoir over the course of the development of the reservoir. For example, initial simulations may be used to generate an initial FDP that specifies initial locations and operating parameters for wells before they are drilled, and follow-up simulations may be used to generate updated FDPs that specify updated operating parameters for wells already drilled and locations and operating parameters for additional wells to be drilled.

SUMMARY

Reservoir simulation can be an important aspect of developing a hydrocarbon reservoir. In many instances, successful development of a hydrocarbon reservoir relies on generation of accurate and timely simulations of scenarios that guide development of the reservoir. For example, a reservoir operator may use a simulation of a hydrocarbon reservoir estimate hydrocarbon production, as well as predict locations of hydrocarbons and other substances, such as injected water, within a hydrocarbon reservoir, and use that knowledge to generate a corresponding field development plan (FDP) that outlines procedures for extracting hydrocarbons from the reservoir. The FDP may, for example, specify locations, trajectories and operational parameters of production wells, injection wells and monitoring wells that extend into the reservoir.

A simulation of a hydrocarbon reservoir (or a "reservoir simulation") typically involves processing a model of the reservoir to predict how fluids will move within the reservoir under a set of operating parameters. For example, the simulation of a hydrocarbon reservoir may include a prediction of how known pockets of hydrocarbons and water will move within the reservoir based on locations and operating parameters (e.g., operating flowrates and pressures) of a set of wells in the reservoir, and include an associated estimate of hydrocarbon production from the wells under the parameters. In some instances, multiple simulations (or "sensitivities") are generated based on different sets of parameters to identify an optimal approach for developing the reservoir. For example, a model of a reservoir may be processed (or "run") for different operational scenarios (e.g., using different combinations of operating flowrates and pressures for wells in the reservoir as inputs to the model) to generate corresponding simulations of the reservoir, one of the simulations that exhibits an efficient production of hydrocarbons from the reservoir may be identified, and the parameters associated with the simulation identified may be employed to produce hydrocarbons from the reservoir.

A model of a reservoir (or a "reservoir model") typically includes a three-dimensional (3D) set of cells that represent the physical layout of the reservoir. For example, a reservoir model may include a structured 3D grid of cuboid shaped cells arranged in rows and columns, with each of the cells representing a respective volume of the reservoir and being associated with corresponding properties (e.g., permeability, porosity or saturation) of the volume represented by the cell. Reservoir models often include relatively large grids (e.g., including thousands, millions or billions of cells) and can include an immense amount of information that is processed to generate corresponding reservoir simulations. In view of the processing requirements, reservoir simulation runs often employ multiple processors (e.g., tens, hundreds or thousands of processors) working in parallel to generate a reservoir simulation. In many instances, processors individually process (or "handle") information for respective subsets of cells of a reservoir model, and the processors exchange information regarding neighboring subsets of cells to account for interactions between the subsets of cells. Accordingly, a reservoir simulation can be computationally complex and can consume a great deal of processing resources. In some instances, more and faster processors are employed in an effort to combat the complexity. Even with the implementation of a relatively large number of high-speed processors, however, reservoir simulations can still require a great deal of time (e.g., hours, days, weeks or months) to complete. This can introduce significant delays in generating reservoir simulations (and corresponding FDPs), and can, in turn, delay development of a reservoir. As a result, reservoir simulations are sometimes viewed as costly from the perspective of computing resources and time required, and field operators often forgo generating reservoir simulations due to a lack of resources and time, even though the simulations are beneficial to the long term development of the reservoir.

Attempts to improve reservoir simulation performance, including attempts to improve reservoir simulation accuracy, speed and efficiency, often have shortcomings. For example, certain reservoir simulation techniques involve dividing a reservoir model into separate sectors (or "regions") that are processed in parallel. These types of sector-based simulations typically rely on sector specific boundary conditions, and do not account for dynamic changes in boundary conditions over the course of the time interval of the simulation. As a result, these types of sector-based simulations may not account for interactions between the sectors, which can lead to inaccuracies in the simulation results.

Provided are systems and methods for multiscale sectors based hydrocarbon reservoir simulation. In some embodiments, a full-field reservoir model is divided into regions and sub-regions, and models of the sub-regions and regions are iteratively assessed and reconnected in a sequential manner to generate an "adjusted" full-field model. This can include, for example, generating and verifying regions within the full-field, generating sub-regions for the verified regions, and sequentially identifying "adjusted" parameters for models of the sub-regions, the regions and the full-field based on iterative-focused -sequential history matching of the models of the sub-regions, the regions and the full-field.

In some embodiments, the area of a full-field reservoir model is segmented into regions to generate corresponding region models, the full-field reservoir model is simulated to identify "full-field" fluid fluxes at the borders of the regions, the region models are simulated to identify "region" fluid fluxes at the borders of the regions, and the full-field and region fluid fluxes are compared to one another to verify the regions. Once verified, the regions are segmented into sub-regions to generate corresponding sub-region models, and parameters for each of the sub-regions models are adjusted/verified based on history matching against historical performance data for the respective sub-regions to generate history matched (or "adjusted") sub-region models. Parameters for each region are, then, adjusted/verified based on history matching of the respective set of adjusted sub-region models for the region (collectively a "region model") against historical performance data for the respective regions to generate history-matched (or "adjusted") region models. Parameters for the full-field are, then, adjusted/verified based on history matching of the set of adjusted region models for the full-field (collectively a "full-field model") against historical performance data for the full-field to generate a history-matched (or "adjusted") full-field model. Such an iterative and multiscale technique enables a reservoir model to be divided into reasonably sized sectors for the purpose of focused processing that can limit the exchange of data between processors, while progressively reconnecting the sectors to generate a full-field model that honors boundary conditions between the sectors. Accordingly, the technique can provide enhancements of reservoir simulation speed and accuracy.

In some embodiments, a multiscale sector hydrocarbon reservoir simulation includes the following: (1) segmenting an area of a full-field model of a hydrocarbon reservoir into regions (e.g., based on regions having similar characteristics, such as pore-volume or well-to-well effects); (2) verifying the regions created, including: (a) simulating the full-field model to determine "full-field" fluid fluxes at the borders of the regions; (b) simulating a model of each of the regions separately to determine "region" fluid fluxes at the borders of the regions; and (c) comparing the "full-field" fluid fluxes to the "region" fluid fluxes to verify that the "region" fluid fluxes match (e.g., are within a threshold of) the "full-field" fluid fluxes; (3) in response verifying that the "region" fluid fluxes match the "full-field" fluid fluxes, then (a) for each region, segmenting each of the regions into sub-regions (e.g., segmenting each of the regions into sub-regions based on areas of similar well mismatch, well density or grid size); (b) for each sub-region, adjusting/verifying parameters of a sub-region model for the sub-region (e.g., including a model of the cells of the sub-region) based on history matching of the sub-region model to generate an adjusted sub-region model for the sub-region (e.g., determining adjusted values of permeability for the entire sub-region that provide an acceptable match between simulated and actual production rates within the sub-region, and employing the adjusted value of permeability in the adjusted sub-region model for the sub-region); (c) for each region (or "sector"), adjusting/verifying parameters of a region model for the region (e.g., including the adjusted sub-region models of the sub-regions of the region) based on history matching of the region model to generate an adjusted region model for the region (e.g., determining adjusted values of permeability for the entire region that provide an acceptable match between simulated and actual production rates within the region, and employing the adjusted values of permeability in the adjusted region model for the region); (d) for the full-field, adjusting/verifying parameters of the full-field based on history matching of a full-field model of the full-field (e.g., including the adjusted region models of the regions of the full-field) to generate an adjusted full-field model (e.g., determining adjusted values of permeability for the full-field that provide an acceptable match of production rates within the full-field, and employing the adjusted values of permeability in the adjusted full-field model for the full-field); and (e) generating a simulation of the reservoir using the adjusted full-field model. In some embodiments, the results of the simulation are used as a basis for developing the reservoir. For example, a FDP for the reservoir may be generated based on the results of the simulation, and wells may be drilled and operated in accordance with the FDP to produce hydrocarbons from the reservoir.

Provided in some embodiments is a method of developing a hydrocarbon reservoir that includes the following: determining a full-field reservoir model of a hydrocarbon reservoir, the full-field reservoir model including a plurality of cells that represent a full-field of the hydrocarbon reservoir; determining regions of the full-field reservoir model; determining, for each of the regions, sub-regions of the region; generating, based on iterative history match based adjustment of the sub-regions, regions and the full-field, an adjusted full-field model of the hydrocarbon reservoir, the generating of the adjusted full-field model of the hydrocarbon reservoir including: for each sub-region, determining an adjusted sub-region model, the determining of the adjusted sub-region model for each sub-region including adjusting parameters of a sub-region model for the sub-region to history match the sub-region model to historic data for the sub-region; for each region, determining an adjusted region model, the determining of the adjusted region model for each region including adjusting parameters of a region model for the region to history match the region model for the region to historic data for the region, the region model for the region including the adjusted sub-region models of the sub-regions within the region; for the full-field, determining an adjusted full-field model, the determining of the adjusted full-field model for the full-field including adjusting parameters of a full-field model for the full-field to history match the full-field model for the full-field to historic parameters for the full-field, the full-field model for the full-field including the adjusted region models of the regions within the full-field; and generating, using the adjusted full-field model, a simulation of the hydrocarbon reservoir.

In some embodiments, determining regions of the full-field reservoir model includes verifying the regions of the full-field reservoir model, the verifying including: conducting, using the full-field reservoir model, a simulation of the hydrocarbon reservoir to determine full-field fluid fluxes for the regions; for each of the regions: conducting, using a region model for the region, a simulation of the region to determine region fluid fluxes for the region; and comparing the region fluid fluxes for the region to the full-field fluid fluxes for the region to verify the region fluid fluxes for the region. In some embodiments, determining regions of the full-field reservoir model includes segmenting the full-field reservoir model into regions based on shared characteristics of the portions of the reservoir corresponding to the regions. In some embodiments, the characteristics include pore-volume or well-to-well effects. In some embodiments, determining sub-regions of a region includes segmenting the region into sub-regions based on shared characteristics of the portions of the reservoir corresponding to the sub-regions. In some embodiments, the characteristics include well mismatch, well density or grid size. In some embodiments, adjusting parameters of the sub-region model for a sub-region to history match the sub-region model to historic data for the sub-region includes adjusting a permeability of the sub-region model for the sub-region to match an output of the sub-region model for the sub-region to observed performance data for the sub-region, adjusting parameters of the region model for a region to history match the region model for the region to historic data for the region includes adjusting permeability of the adjusted sub-region models of the sub-regions within the region to match an output of the adjusted sub-region models of the sub-regions within the region to observed performance data for the region, and adjusting parameters of a full-field model for the full-field to history match the full-field model for the full-field to historic parameters for the full-field includes adjusting permeability of the adjusted region models of the regions within the full-field to match an output of the adjusted region models of the regions within the full-field to observed performance data for the full-field. In some embodiments, adjusting permeability of the adjusted sub-region models of the sub-regions within a region includes adjusting the permeabilities of the adjusted sub-region models of the sub-regions within the region by a given region factor, and adjusting permeability of the adjusted region models of the regions within the full-field includes adjusting the permeabilities of the adjusted region models of the regions within the full-field by a given full-field factor. In some embodiments, the method further includes: generating a FDP for the hydrocarbon reservoir based on the simulation of the hydrocarbon reservoir. In some embodiments, the method further includes: identifying well drilling parameters based on the simulation of the hydrocarbon reservoir; and drilling a well in the hydrocarbon reservoir based on the well drilling parameters. In some embodiments, the method further includes identifying well operating parameters based on the simulation of the hydrocarbon reservoir; and operating a well in the hydrocarbon reservoir based on the well operating parameters.

Provided in some embodiment is a non-transitory computer readable storage medium including program instructions stored thereon that are executable by a processor to perform the following operations for developing a hydrocarbon reservoir: determining a full-field reservoir model of a hydrocarbon reservoir, the full-field reservoir model including a plurality of cells that represent a full-field of the hydrocarbon reservoir; determining regions of the full-field reservoir model; determining, for each of the regions, sub-regions of the region; generating, based on iterative history match based adjustment of the sub-regions, regions and the full-field, an adjusted full-field model of the hydrocarbon reservoir, the generating of the adjusted full-field model of the hydrocarbon reservoir including: for each sub-region, determining an adjusted sub-region model, the determining of the adjusted sub-region model for each sub-region including adjusting parameters of a sub-region model for the sub-region to history match the sub-region model to historic data for the sub-region; for each region, determining an adjusted region model, the determining of the adjusted region model for each region including adjusting parameters of a region model for the region to history match the region model for the region to historic data for the region, the region model for the region including the adjusted sub-region models of the sub-regions within the region; for the full-field, determining an adjusted full-field model, the determining of the adjusted full-field model for the full-field including adjusting parameters of a full-field model for the full-field to history match the full-field model for the full-field to historic parameters for the full-field, the full-field model for the full-field including the adjusted region models of the regions within the full-field; and generating, using the adjusted full-field model, a simulation of the hydrocarbon reservoir.

In some embodiments, determining regions of the full-field reservoir model includes verifying the regions of the full-field reservoir model, the verifying including: conducting, using the full-field reservoir model, a simulation of the hydrocarbon reservoir to determine full-field fluid fluxes for the regions; for each of the regions: conducting, using a region model for the region, a simulation of the region to determine region fluid fluxes for the region; and comparing the region fluid fluxes for the region to the full-field fluid fluxes for the region to verify the region fluid fluxes for the region. In some embodiments, determining regions of the full-field reservoir model includes segmenting the full-field reservoir model into regions based on shared characteristics of the portions of the reservoir corresponding to the regions. In some embodiments, the characteristics include pore-volume or well-to-well effects. In some embodiments, determining sub-regions of a region includes segmenting the region into sub-regions based on shared characteristics of the portions of the reservoir corresponding to the sub-regions. In some embodiments, the characteristics include well mismatch, well density or grid size. In some embodiments, adjusting parameters of the sub-region model for a sub-region to history match the sub-region model to historic data for the sub-region includes adjusting a permeability of the sub-region model for the sub-region to match an output of the sub-region model for the sub-region to observed performance data for the sub-region, adjusting parameters of the region model for a region to history match the region model for the region to historic data for the region includes adjusting permeability of the adjusted sub-region models of the sub-regions within the region to match an output of the adjusted sub-region models of the sub-regions within the region to observed performance data for the region, and adjusting parameters of a full-field model for the full-field to history match the full-field model for the full-field to historic parameters for the full-field includes adjusting permeability of the adjusted region models of the regions within the full-field to match an output of the adjusted region models of the regions within the full-field to observed performance data for the full-field. In some embodiments, adjusting permeability of the adjusted sub-region models of the sub-regions within a region includes adjusting the permeabilities of the adjusted sub-region models of the sub-regions within the region by a given region factor, and adjusting permeability of the adjusted region models of the regions within the full-field includes adjusting the permeabilities of the adjusted region models of the regions within the full-field by a given full-field factor. In some embodiments, the method further includes generating a FDP for the hydrocarbon reservoir based on the simulation of the hydrocarbon reservoir. In some embodiments, the method further includes: identifying well drilling parameters based on the simulation of the hydrocarbon reservoir; and drilling a well in the hydrocarbon reservoir based on the well drilling parameters. In some embodiments, the method further includes: identifying well operating parameters based on the simulation of the hydrocarbon reservoir; and operating a well in the hydrocarbon reservoir based on the well operating parameters.

Provided in some embodiments is a hydrocarbon reservoir development system that includes the following: a hydrocarbon reservoir control system including non-transitory computer readable storage medium including program instructions stored thereon that are executable by a processor to perform the following operations for developing a hydrocarbon reservoir: determining a full-field reservoir model of a hydrocarbon reservoir, the full-field reservoir model including a plurality of cells that represent a full-field of the hydrocarbon reservoir; determining regions of the full-field reservoir model; determining, for each of the regions, sub-regions of the region; generating, based on iterative history match based adjustment of the sub-regions, regions and the full-field, an adjusted full-field model of the hydrocarbon reservoir, the generating of the adjusted full-field model of the hydrocarbon reservoir including: for each sub-region, determining an adjusted sub-region model, the determining of the adjusted sub-region model for each sub-region including adjusting parameters of a sub-region model for the sub-region to history match the sub-region model to historic data for the sub-region; for each region, determining an adjusted region model, the determining of the adjusted region model for each region including adjusting parameters of a region model for the region to history match the region model for the region to historic data for the region, the region model for the region including the adjusted sub-region models of the sub-regions within the region; for the full-field, determining an adjusted full-field model, the determining of the adjusted full-field model for the full-field including adjusting parameters of a full-field model for the full-field to history match the full-field model for the full-field to historic parameters for the full-field, the full-field model for the full-field including the adjusted region models of the regions within the full-field; and generating, using the adjusted full-field model, a simulation of the hydrocarbon reservoir.

In some embodiments, determining regions of the full-field reservoir model includes verifying the regions of the full-field reservoir model, the verifying including: conducting, using the full-field reservoir model, a simulation of the hydrocarbon reservoir to determine full-field fluid fluxes for the regions; for each of the regions: conducting, using a region model for the region, a simulation of the region to determine region fluid fluxes for the region; and comparing the region fluid fluxes for the region to the full-field fluid fluxes for the region to verify the region fluid fluxes for the region. In some embodiments, the method further includes determining regions of the full-field reservoir model includes segmenting the full-field reservoir model into regions based on shared characteristics of the portions of the reservoir corresponding to the regions. In some embodiments, the characteristics include pore-volume or well-to-well effects. In some embodiments, determining sub-regions of a region includes segmenting the region into sub-regions based on shared characteristics of the portions of the reservoir corresponding to the sub-regions. In some embodiments, the characteristics include well mismatch, well density or grid size. In some embodiments, adjusting parameters of the sub-region model for a sub-region to history match the sub-region model to historic data for the sub-region includes adjusting a permeability of the sub-region model for the sub-region to match an output of the sub-region model for the sub-region to observed performance data for the sub-region, adjusting parameters of the region model for a region to history match the region model for the region to historic data for the region includes adjusting permeability of the adjusted sub-region models of the sub-regions within the region to match an output of the adjusted sub-region models of the sub-regions within the region to observed performance data for the region, and adjusting parameters of a full-field model for the full-field to history match the full-field model for the full-field to historic parameters for the full-field includes adjusting permeability of the adjusted region models of the regions within the full-field to match an output of the adjusted region models of the regions within the full-field to observed performance data for the full-field. In some embodiments, adjusting permeability of the adjusted sub-region models of the sub-regions within a region includes adjusting the permeabilities of the adjusted sub-region models of the sub-regions within the region by a given region factor, and adjusting permeability of the adjusted region models of the regions within the full-field includes adjusting the permeabilities of the adjusted region models of the regions within the full-field by a given full-field factor. In some embodiments, the method further includes generating a field development plan (FDP) for the hydrocarbon reservoir based on the simulation of the hydrocarbon reservoir. In some embodiments, the method further includes: identifying well drilling parameters based on the simulation of the hydrocarbon reservoir; and drilling a well in the hydrocarbon reservoir based on the well drilling parameters. In some embodiments, the method further includes: identifying well operating parameters based on the simulation of the hydrocarbon reservoir; and operating a well in the hydrocarbon reservoir based on the well operating parameters.

Figure 1:
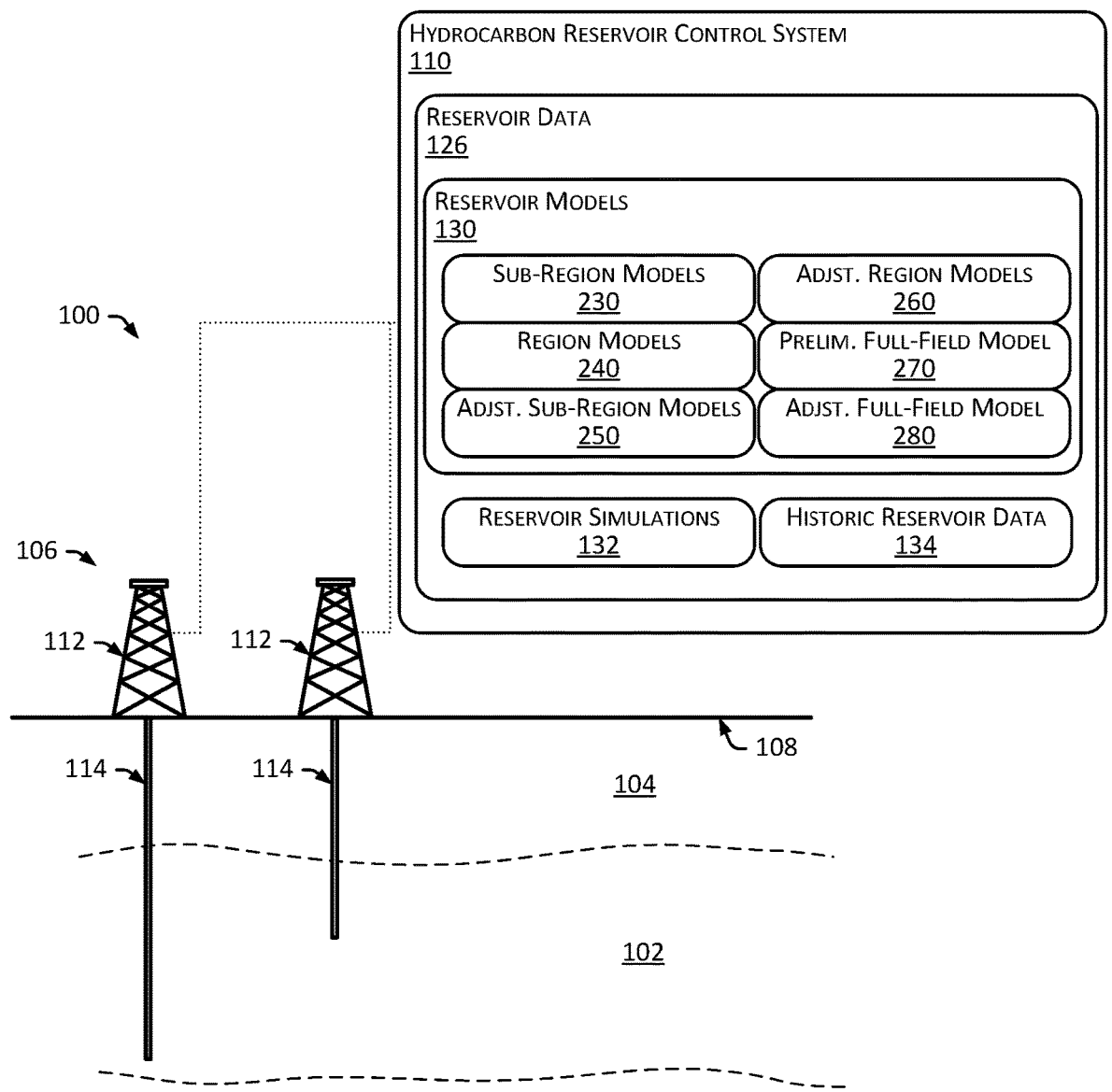
FIG. 1 is diagram that illustrates a hydrocarbon reservoir environment in accordance with one or more embodiments.

While this disclosure is susceptible to various modifications and alternative forms, specific embodiments are shown by way of example in the drawings and will be described in detail. The drawings may not be to scale. It should be understood that the drawings and the detailed descriptions are not intended to limit the disclosure to the particular form disclosed, but are intended to disclose modifications, equivalents, and alternatives falling within the spirit and scope of the present disclosure as defined by the claims.

DETAILED DESCRIPTION

Described are systems and methods for multiscale sectors based hydrocarbon reservoir simulation. In some embodiments, a full-field reservoir model is divided into regions and sub-regions, and models of the sub-regions and regions are iteratively assessed and reconnected in a sequential manner to generate an "adjusted" full-field model. This can include, for example, generating and verifying regions within the full-field, generating sub-regions for the verified regions, and sequentially identifying "adjusted" parameters for models of the sub-regions, the regions and the full-field based on iterative-focused -sequential history matching of the models of the sub-regions, the regions and the full-field.

In some embodiments, the area of a full-field reservoir model is segmented into regions to generate corresponding region models, the full-field reservoir model is simulated to identify "full-field" fluid fluxes at the borders of the regions, the region models are simulated to identify "region" fluid fluxes at the borders of the regions, and the full-field and region fluid fluxes are compared to one another to verify the regions. Once verified, the regions are segmented into sub-regions to generate corresponding sub-region models, and parameters for each of the sub-regions models are adjusted/verified based on history matching against historical performance data for the respective sub-regions to generate history matched (or "adjusted") sub-region models. Parameters for each region are, then, adjusted/verified based on history matching of the respective set of adjusted sub-region models for the region (collectively a "region model") against historical performance data for the respective regions to generate history-matched (or "adjusted") region models. Parameters for the full-field are, then, adjusted/verified based on history matching of the set of adjusted region models for the full-field (collectively a "full-field model") against historical performance data for the full-field to generate a history-matched (or "adjusted") full-field model. Such an iterative and multiscale technique enables a reservoir model to be divided into reasonably sized sectors for the purpose of focused processing that can limit the exchange of data between processors, while progressively reconnecting the sectors to generate a full-field model that honors boundary conditions between the sectors. Accordingly, the technique can provide enhancements of reservoir simulation speed and accuracy.

In some embodiments, a multiscale sector hydrocarbon reservoir simulation includes the following: (1) segmenting an area of a full-field model of a hydrocarbon reservoir into regions (e.g., based on regions having similar characteristics, such as pore-volume or well-to-well effects); (2) verifying the regions created, including: (a) simulating a full-field model to determine "full-field" fluid fluxes at the borders of the regions; (b) simulating a model of each of the regions separately to determine "region" fluid fluxes at the borders of the regions; and (c) comparing the "full-field" fluid fluxes to the "region" fluid fluxes to verify that the "region" fluid fluxes match (e.g., are within a threshold of) the "full-field" fluid fluxes; (3) in response verifying that the "region" fluid fluxes match the "full-field" fluid fluxes, then (a) for each region, segmenting each of the regions into sub-regions (e.g., segmenting each of the regions into sub-regions based on areas of similar well mismatch, well density or grid size); (b) for each sub-region, adjusting/verifying parameters of a sub-region model for the sub-region (e.g., including a model of the cells of the sub-region) based on history matching of the sub-region model to generate an adjusted sub-region model for the sub-region (e.g., determining adjusted values of permeability for the entire sub-region that provide an acceptable match between simulated and actual production rates within the sub-region, and employing the adjusted value of permeability in the adjusted sub-region model for the sub-region); (c) for each region (or "sector"), adjusting/verifying parameters of a region model for the region (e.g., including the adjusted sub-region models of the sub-regions of the region) based on history matching of the region model to generate an adjusted region model for the region (e.g., determining adjusted values of permeability for the entire region that provide an acceptable match between simulated and actual production rates within the region, and employing the adjusted value of permeability in the adjusted region model for the region); (d) for the full-field, adjusting/verifying parameters of the full-field based on history matching of a full-field model of the full-field (e.g., including the adjusted region models of the regions of the full-field) to generate an adjusted full-field model (e.g., determining adjusted values of permeability for the full-field that provide an acceptable match of production rates within the full-field, and employing the adjusted value of permeability in the adjusted full-field model for the full-field); and (e) generating a simulation of the reservoir using the adjusted full-field model. In some embodiments, the results of the simulation are used as a basis for developing the reservoir. For example, a FDP for the reservoir may be generated based on the results of the simulation, and wells may be drilled and operated in accordance with the FDP to produce hydrocarbons from the reservoir.

FIG. 1 is a diagram that illustrates a hydrocarbon reservoir environment ("reservoir environment") 100 in accordance with one or more embodiments. In the illustrated embodiment, the reservoir environment 100 includes a hydrocarbon reservoir ("reservoir") 102 located in a subsurface formation ("formation") 104, and a hydrocarbon reservoir development system 106.

The formation 104 may include a porous or fractured rock formation that resides underground, beneath the Earth's surface ("surface") 108. The reservoir 102 may include a portion of the formation 104 that contains (or that is determined to contain) a subsurface pool of hydrocarbons, such as oil and gas. The formation 104 and the reservoir 102 may each include different layers of rock having varying characteristics (e.g., varying degrees of permeability, porosity or fluid saturation). The hydrocarbon reservoir development system 106 may facilitate the extraction (or "production") of hydrocarbons from the reservoir 102.

In some embodiments, the hydrocarbon reservoir development system 106 includes a hydrocarbon reservoir control system ("control system") 110 and one or more wells 112. In some embodiments, the control system 110 includes a computer system that is the same as or similar to that of computer system 1000 described with regard to at least FIG. 5. Each of the wells 112 may include a wellbore 114 that extends from the surface 108 into a target zone of the formation 104, such as the reservoir 102. The wellbore 114 may be created, for example, by a drill bit boring along a path (or "trajectory") through the formation 104 and the reservoir 102.

In some embodiments, the control system 110 controls operations for developing the reservoir 102. For example, the control system 110 may control logging operations used to acquire data for the reservoir 102, and may control processing that generates models and simulations (e.g., based on the data for the reservoir 102) that characterize the reservoir 102. In some embodiments, the control system 110 determines drilling parameters for the wells 112 in the reservoir 102, determines operating parameters for the wells 112 in the reservoir 102, controls drilling of the wells 112 in accordance with drilling parameters, or controls operating the wells 112 in accordance with the operating parameters. This can include, for example, the control system 110 determining drilling parameters (e.g., determining well locations and trajectories) for the reservoir 102, controlling drilling of the wells 112 in accordance with the drilling parameters (e.g., controlling a well drilling system of the hydrocarbon reservoir development system 106 to drill the wells 112 at the well locations and with the wellbores 114 following the trajectories), determining operating parameters (e.g., determining production rates and pressures for "production" wells 112 and injection rates and pressure for "injections" wells 112), and controlling operations of the wells 112 in accordance with the operating parameters (e.g., controlling a well operating system of the hydrocarbon reservoir development system 106 to operate the production wells 112 to produce hydrocarbons from the reservoir 102 in accordance with the production rates and pressures determined for the respective wells 112, and controlling the injection wells 112 to inject substances, such as water, into the reservoir 102 in accordance with the injection rates and pressures determined for the respective wells 112). In some embodiments, the control system 110 determines monitoring parameters or controls operations of "monitoring" wells 112. For example, the control system 110 may determine wellbore logging parameters for monitoring wells 112, and control logging tools and sensors within the wellbores 114 of the monitoring wells 112 in accordance with the wellbore logging parameters for the monitoring wells 112.

In some embodiments, the control system 110 stores in a memory, or otherwise has access to, reservoir data 126. The reservoir data 126 may include data that is indicative of properties of the reservoir 102. In some embodiments, the reservoir data 126 includes one or more models of the reservoir 102 (or "reservoir models" or "models") 130, one or more simulations of the reservoir 102 (or "reservoir simulations" or "simulations") 132, or historic data for the reservoir 102 (or "historic reservoir data") 136. As described here, the simulations 132 may include "multiscale sector" type simulations.

A reservoir model 130 may include a three-dimensional (3D) grid of cells (or "grid cells") representing a portion of the reservoir 102. Each of the cells may include a cuboid cell (or similar shaped cell) that represents a corresponding volume within the reservoir 102. Each of the cells may be associated with properties of the volume represented by the cell. The properties may include properties of the volume itself (e.g., permeability, porosity or fluid saturation of the rock located in volume represented by the cell) or properties of interfaces with adjacent cells (e.g., fluid fluxes that represent fluid interchange between the volume represented by cell and respective ones of the other volumes represented by cells directly adjacent to the cell). The properties of each of the cells may be determined based on data acquired for the reservoir 102, such as data of seismic logs of the reservoir 102, data of downhole logs of wells drilled into the reservoir 102, data acquired by way of assessment core samples extracted from the reservoir 102, or data recorded for another reservoir having characteristics that are the same or similar to those of the reservoir 102.

In some instances, a reservoir model 130 is represented in "graph form." This can include each of the cells of the reservoir model 130 being represented by a vertex of a graph, and each of the respective interfaces between pairs of adjacent cells of the model 130 being represented by an edge of the graph that extends between the respective vertices representing the cells of the pair of adjacent cells. In such a representation, each vertex may be associated with (or be defined by) properties of the respective cell. For example, each vertex may be associated with a permeability, porosity, or water saturation of the volume of the reservoir 102 represented by the associated cell. Each of the edges may span between vertices of adjacent cells and be associated with (or be defined by) properties of the interface between the adjacent cells. For example, each edge may be associated with a fluid flux for the pair of adjacent cells associated with the vertices at the ends of the edge. A fluid flux for a pair of adjacent cells may be indicative of the flow of fluids across the interface (or "shared face") between the pair of adjacent cells. A relatively high flux value for a pair of adjacent cells may indicate a relatively high rate of fluid exchange between the adjacent cells, and a relatively low flux value for a pair of adjacent cells may indicate a relatively low rate of fluid exchange between the adjacent cells. In some embodiments, fluid fluxes for cells are determined by way of a reservoir simulation 132. For example, a reservoir simulation 132 that characterizes fluid migration within the reservoir 102 over a time interval may provide instantaneous fluid flux values between each of the cells at different instants of time within the time interval.

A simulation of the reservoir 102 (or "reservoir simulation") 132 may include data that represents predicted movement of fluids, such as water or hydrocarbons, within the reservoir 102 and the production of fluids, such as hydrocarbons, from the reservoir 102, over time. In some embodiments, a simulation of the reservoir 102 is generated based on a reservoir model 130. For example, a reservoir simulation 132 may include a snapshot of where fluid is expected to be within the reservoir 102 one year from now, and a volume of hydrocarbons to be produced from the reservoir 102 over the year, based on a reservoir model 130 that indicates present characteristics of the reservoir 102 (e.g., a modeling of the current location of water and hydrocarbons in the reservoir 102) and expected operating parameters for the reservoir 102 over the next year (e.g., a predicted set operating flowrates and pressures for the wells 112 over the next year). In some embodiments, a reservoir simulation 132 includes a sequence of snapshots over time that demonstrates the predicted movement of fluids within the reservoir 102 and hydrocarbon production at different times (e.g., at year one, at year two, and year three). Simulations 132 may be used to determine how to develop the reservoir 102. For example, a simulation 132 of the reservoir 102 may be used to determine drilling or operating parameters for wells 112 in the reservoir 102.

Historic reservoir data 134 may include data that is indicative of historic operating parameters and performance of the reservoir 102. For example, historic reservoir data 134 may include a record of observed operating pressures and production rates for the wells 112 over a given time interval, and a record of observed hydrocarbon production over the given time interval. In some embodiments, the historic reservoir data 134 is used for history-matching reservoir models 130 (or similar representations of the reservoir 102). For example, a history-match of a reservoir model 130 based on historic reservoir data 134 for a given year may include conducting a simulation run using a set of operating parameters corresponding to the observed operating pressures and production rates for the wells 112 over the year (e.g., obtained from the historic reservoir data 134) to a reservoir model 130, determining a "simulated" hydrocarbon production for the year based on the resulting simulation 132, and comparing the simulated hydrocarbon production to the observed hydrocarbon production for the year (e.g., obtained from the historic reservoir data 134). If the simulated and observed hydrocarbon production values are within a threshold of one another (e.g., if the simulated hydrocarbon production is within +/−10% of the observed hydrocarbon production), the reservoir model 130 may be verified as a "match". If the simulated and observed hydrocarbon production values are not within the threshold of one another (e.g., if the simulated hydrocarbon production is not within +/−10% of the observed hydrocarbon production), the reservoir model 130 may be not be verified as a "match", the reservoir model 130 may be adjusted (e.g., a parameter of the reservoir model 130, such as formation permeability, may be modified), and the "adjusted" reservoir model 130 may be subjected to history-matching. Such a history-matching/adjustment cycle may continue until the reservoir model 130 is a match, or it is determined that a "matching" reservoir model cannot be generated.

As described here, a reservoir model 130 may be processed in accordance with a multiscale sector based hydrocarbon reservoir simulation technique to generate a reservoir simulation 132. For example, a reservoir model 130 including a grid of cells representing a full-field of the reservoir 102 may be divided (or "partitioned") into regions and sub-regions, and models of the sub-regions, the regions and the full-field may be iteratively and sequentially history-matched and adjusted to generate an "adjusted full-field" reservoir model 130 that is used to generate a simulation 132 of the reservoir 102.

Figure 2:
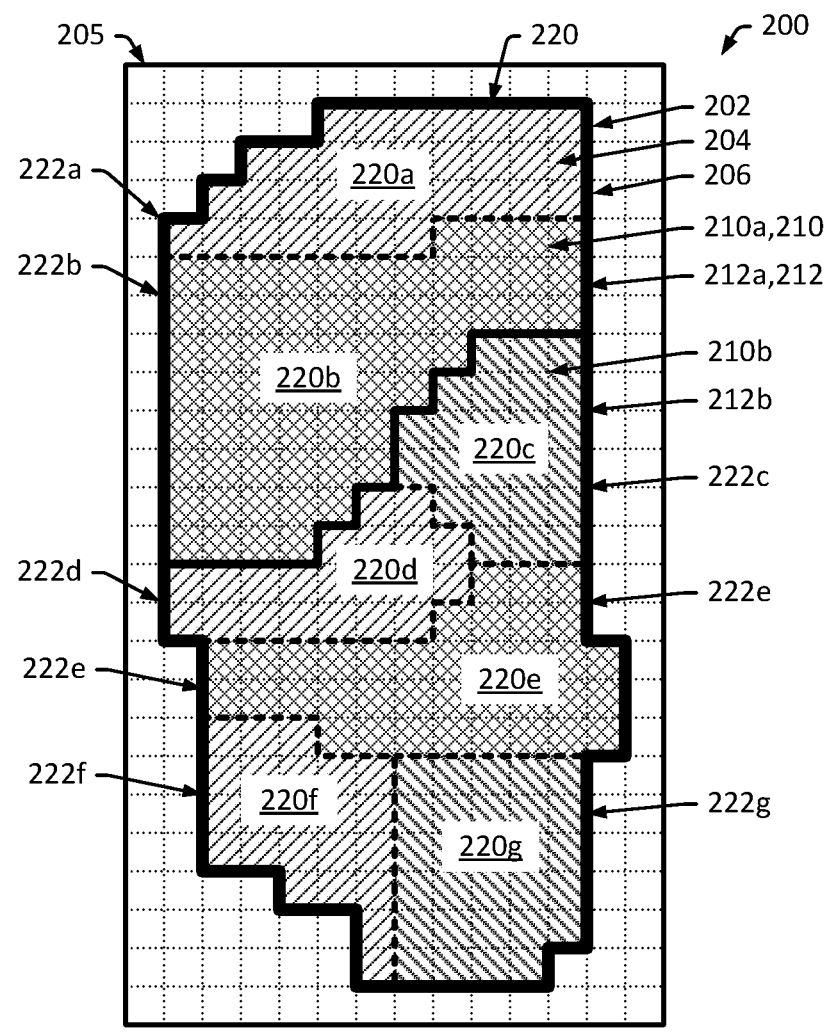
FIG. 2 is a diagram that illustrates a partitioned hydrocarbon reservoir model in accordance with one or more embodiments.

FIG. 2 is a diagram that illustrates a partitioned hydrocarbon reservoir model 200 in accordance with one or more embodiments. In the illustrated embodiment the partitioned hydrocarbon reservoir model 200 includes a full-field 202 that is defined by cells 204 (of a grid of cells 205) that are located within a full-field boundary 206 (defined by the thick black line).

The full-field 202 is divided (or "partitioned") into two regions 210. The two regions 210 include a first/upper region 210a and a second/lower region 210b. The regions 210 are each defined by the plurality of cells 204 located within respective region boundaries 212. The first/upper region 210a is defined by the cells 204 located within a first region boundary 212a (defined by the upper portion of the thick black line enclosing the full-field 202 and the solid line running horizontally through the full-field 202), and the second/lower region 210a is defined by the cells 204 located within a second region boundary 212b (defined by the lower portion of the thick black line enclosing the full-field 202 and the solid line running horizontally through the full-field 202). Each of the regions 210 is sub-divided (or "sub-partitioned") into sub-regions 220. The first/upper region 210a is sub-divided into two sub-regions 220, including a first sub-region 220a and a second sub-region 220b. The second/lower region 210b is sub-divided into five sub-regions 220, including a third sub-region 220c, a fourth sub-region 220d, a fifth sub-region 220e, a sixth sub-region 220f and a seventh sub-region 220g. The sub-regions 220 are defined by the cells 204 located within respective sub-region boundaries 222. The sub-regions 220a-220g include respective sets of cells 204 located within respective first, second, third, fourth, fifth, sixth and seventh sub-region boundaries 222a-222g (each represented by respective portions of the thick black line enclosing the full-field 202, the solid line running horizontally through the full-field 202, and/or the dashed lines within the regions 210 of the full-field 202).

With reference to the cellular form of the model 130 depicted, each of the boundaries 206, 212 and 222 are defined by a path that extends between adjacent cells 204 of the model 130. Boundaries may overlap in certain locations based on them being defined by shared interfaces between adjacent cells 204 in those locations. With reference to a graph form of the model 130, (which may include vertices that each represent properties of a respective cell 204 and edges extending between the vertices that represent interfaces between adjacent cells 204) each of the boundaries 206, 212 and 222 may intersect (or "cut") edges that extend between adjacent pairs of cells on either side of the boundaries 206, 212 and 222. In such an embodiment, the fluid fluxes represented by the edges cut by the full-field boundary 206, a region boundary 212, or sub-region boundary 222 may represent the fluid flow into or out of the respective full-field 202, region 210 or sub-region 220. For example, a sum of the fluid flux values of the edges cut by the first region boundary 212a may represent a net fluid flow into (or out of) the first/upper region 210a. As a further example, a sum of the fluid flux values of the edges cut by the first sub-region boundary 222a may represent a net fluid flow into or out of the first sub-region 220a.

In some embodiments, production of the full-field 202, a region 210 or sub-region 220 may represent the net production from wells located in the respective full-field 202, region 210 or sub-region 220. For example, a sum of the production extracted over a given period of time from wells located within the first/upper region boundary 212a may represent a production of the first region 210a over the period of time. As a further example, a sum of the production extracted over a given period of time from wells located within the first sub-region boundary 222a may represent a production of the first sub-region 220a over the period of time.

In some embodiments, a model for an area is defined by the set of cells 204 within the area. For example, the set of cells within each sub-region 220 may define a "sub-region" model 230 for the respective sub-region 220, the set of cells within each region 210 may define a "region" model 240 for the respective region 210, and the set of cells within the full-field 202 may define a "full-field" model for the full field 202. Accordingly, a region model 240 for a region 210 may be formed of sub-region models 230 for the sub-regions 220 within the region 210, and the full-field model may be formed of the region models 240 for the regions 210 within the full field 202.

In some embodiments, the full-field reservoir model 130 for the full-field 202 is divided (or "partitioned") into regions 210 and sub-regions 220), and models of the sub-regions and regions are iteratively assessed and reconnected in a sequential manner to generate an "adjusted" full-field reservoir model 130 for the full-field 202. This can include, for example, generating and verifying the regions 210 within the full-field 202 of the reservoir 102, generating the sub-regions 220 for the verified regions 210, and sequentially identifying "adjusted" parameters for models of the sub-regions 220, the regions 210 and the full-field 202 based on iterative-focused-sequential history matching of the models of the sub-regions 220, the regions 210 and the full-field 202. In some embodiments, the area of a full-field reservoir model 130 is segmented according to the regions 210 to generate corresponding region models 240, the full-field reservoir model 130 is simulated to identify "full-field" fluid fluxes at the region boundaries 212 of the regions 210, the region models 240 are simulated to identify "region" fluid fluxes at the boundaries 212 of the regions 210, and the full-field and region fluid fluxes are compared to one another to verify the regions 210. Once verified, the regions 210 are segmented into the sub-regions 220 to generate corresponding sub-region models 230, and parameters for each of the sub-regions models 230 are adjusted/verified based on history matching against historical performance data for the respective sub-regions 220 to generate history matched (or "adjusted") sub-region models 250. Parameters for each region 210 are, then, adjusted/verified based on history matching of the respective set of adjusted sub-region models 230 (collectively the region model 240) for the regions 210 against historical performance data for the respective regions 210 to generate history-matched (or "adjusted") region models 260. Parameters for the full-field 202 are, then, adjusted/verified based on history matching of the set of adjusted region models 260 (collectively the preliminary full-field model 270) for the full-field 202 against historical performance data for the full-field 202 to generate a history-matched (or "adjusted") full-field model 280. Such an iterative and multiscale technique enables the reservoir model 130 to be divided into reasonably sized sectors for the purpose of focused processing, while iteratively reconnecting the sectors to generate an "adjusted" full-field model 280 that honors boundary conditions between the sectors.

Figure 3:
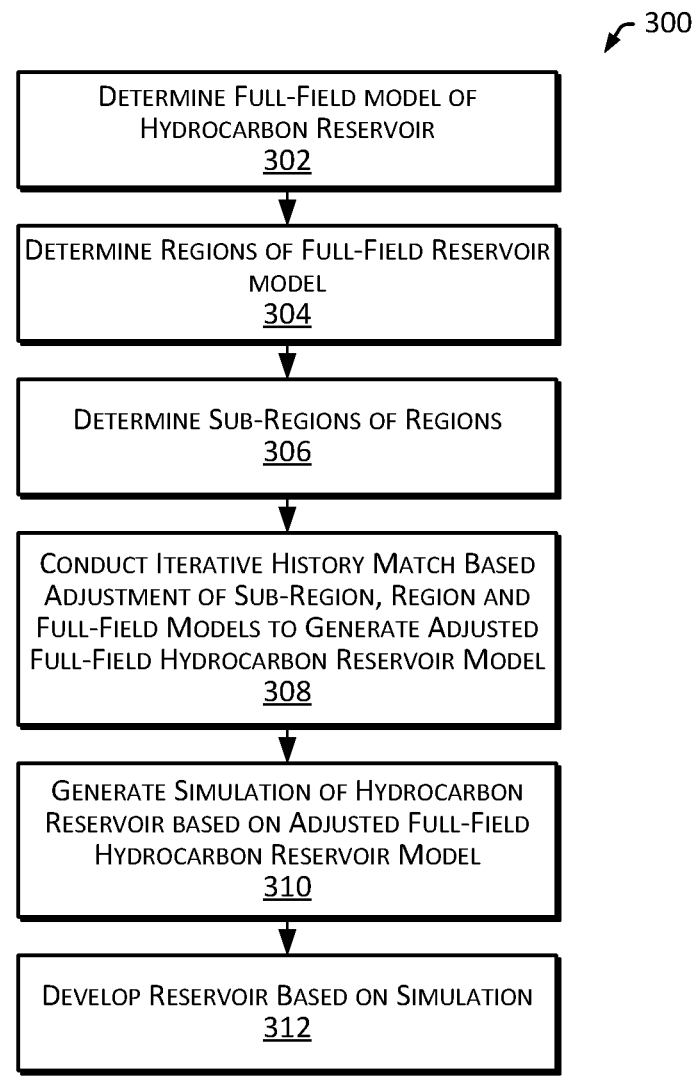
FIG. 3 is a flowchart that illustrates a method of hydrocarbon reservoir development in accordance with one or more embodiments.

FIG. 3 is a flowchart that illustrates a method of hydrocarbon reservoir modeling, simulation and development in accordance with one or more embodiments. Some or all of the procedural elements of method 300 may be performed, for example, by the control system 110 or another reservoir operator.

In some embodiments, the method 300 includes determining a full-field model of a hydrocarbon reservoir (block 302). Determining a full-field reservoir model of a hydrocarbon reservoir may include obtaining data defining a 3D grid of cells representing a portion of the reservoir. For example, referring to FIG. 3, this may include the control system 110 determining or retrieving a "full-field" reservoir model 130 that includes data defining the cells 204 of the full-field 202 of the reservoir 102. Each of the cells 204 may be associated with corresponding properties (e.g., permeability, porosity or saturation) of the volume of the reservoir 102 represented by the cell 204.

In some embodiments, the method 300 includes determining regions of the full-field model (block 304). Determining regions of the full-field model may include determining region boundaries within the full-field model. For example, referring to FIG. 3, this may include the control system 110 determining the paths of the region boundaries 212, which define the regions 210. In some embodiments, the regions 210 are determined to include areas of similar characteristics, such as pore-volume or well-to-well effects. For example, the first region boundary 212a may be determined based on it enclosing an area in which the pore-volume or well-to-well effects are similar across the area, and the second region boundary 212b may be determined based on it enclosing an area in which the pore-volume or well-to-well effects are similar across the area of the second region 212b. A characteristic may be determined to be similar across an area if the value of the characteristic for the cells 204 within the area exhibit a standard deviation that is below a specified threshold, or the values of the characteristic are within a given threshold of one another (e.g., within 15% of one another). Pore volume may be a measure of the air (or "porous") volume to total volume (e.g., the ratio of air space within a cell 204 to its total volume). Well-to-well effects for a volume may be a measure of the impact of nearby wells on the volume (e.g., a value representing to imposition of pressure or flow variations within a cell 204 due to production or injections of nearby wells).

In some embodiments, determining regions of the full-field model includes verifying regions identified. Referring to FIG. 3, Verifying the regions identified may include segmenting the area of a full-field reservoir model 130 according to the regions 210 to generate corresponding region models 240, generating a simulation of the full-field reservoir model 130 to identify "full-field" fluid fluxes at the region boundaries 212, generating separate simulations the region models 240 to identify "region" fluid fluxes at each of the boundaries 212 of the regions 210, and comparing the region fluid fluxes to corresponding full-field fluid fluxes to verify the validity of the regions 210 identified. For example, this may include the following: (a) generating a simulation using the full-field model 130 to determine "full-field" fluid fluxes for each of the regions 210, including fluid flux values at the region boundaries 212a and 212b based on the simulation using the full-field model 130; (b) generating separate simulations for each of the first/upper region 210a and the second/lower region 210b using respective first and second region models 240 to determine "region" fluid fluxes for each of the first/upper region 210a and the second/lower region 210b (including fluid flux values at the first region boundary 212a based on the simulation using the first region model 240 and at the second region boundary 212b based on the simulation using the second region model 240); and (c) for each of the first/upper region 210a and the second/lower region 210b, comparing the region fluid fluxes to corresponding full-field fluid fluxes to verify that they match. This may include comparing a sum of the fluid flux values at the first region boundary 212a based on the simulation using the first region model 240 to fluid flux values at the first region boundary 212a based on the simulation using the full-field model 130, to verify that the sums match, and comparing a sum of the fluid flux values at the second region boundary 212b based on the simulation using the first region model 240 to fluid flux values at the second region boundary 212b based on the simulation using the full-field model 130, to verify that the sums match. The sums (and the corresponding fluid fluxes) may be consider to match if the sum associated with the "region" fluid fluxes are within a threshold (e.g., within 10%) of the sum associated with the "full-field" fluid fluxes. If the regions fluid fluxes for a region 210 do not match, the proposed regions 210 are not verified, and the regions boundaries 212 may be modified an reevaluated for verification. If the regions fluid fluxes for the regions 210 do match, the proposed regions 210 may be verified.

In some embodiments, the method 300 includes determining sub-regions of the regions (block 306). Determining sub-regions of the regions may include determining region boundaries within the full-field model. For example, referring to FIG. 3, this may include the control system 110 determining the locations of the sub-region boundaries 222, which define the sub-regions 220. In some embodiments, the sub-regions 220 are determined to include areas of similar characteristics, such as similar degrees of well mismatch, well density or grid size. For example, each of the sub-region boundaries 222a-222g may be determined based the boundaries each enclosing an area in which the well mismatch is similar across the area, and the well density or grid size is similar for each of the sub-regions 220a-220g. A characteristic may be determined to be similar across an area if the value of the characteristic for the cells 204 within the area exhibit a standard deviation that is below a specified threshold, or are the values of the characteristic are within a given threshold of one another (e.g., within 15% of one another). Well mismatch may be measure of the difference between a value determined based on a simulation (a "simulated value") and a value determined based on corresponding observed data (an "observed value"). For example, well mismatch may be percentage difference of an observed value of well pressure at a given well flowrate and a simulated value of well pressure determined by applying the given well flowrate to a modeling of the well to generate the simulated value of well pressure. Sub-regions 220 may be defined to enclose areas including wells having similar values of well mismatch. Well density may be a measure of a number of wells per unit area. Grid size for an area may be a measure of the number of cells within the area.

In some embodiments, the method 300 includes conducting iterative history match based adjustment of the sub-regions, the regions and the full-field to generate an adjusted full-field hydrocarbon reservoir model (block 308). This may include conducting iterative-focused-sequential history matching of sub-region models, region models and a full-field model to generate an "adjusted" full-field reservoir model for the full-field.

Figure 4:
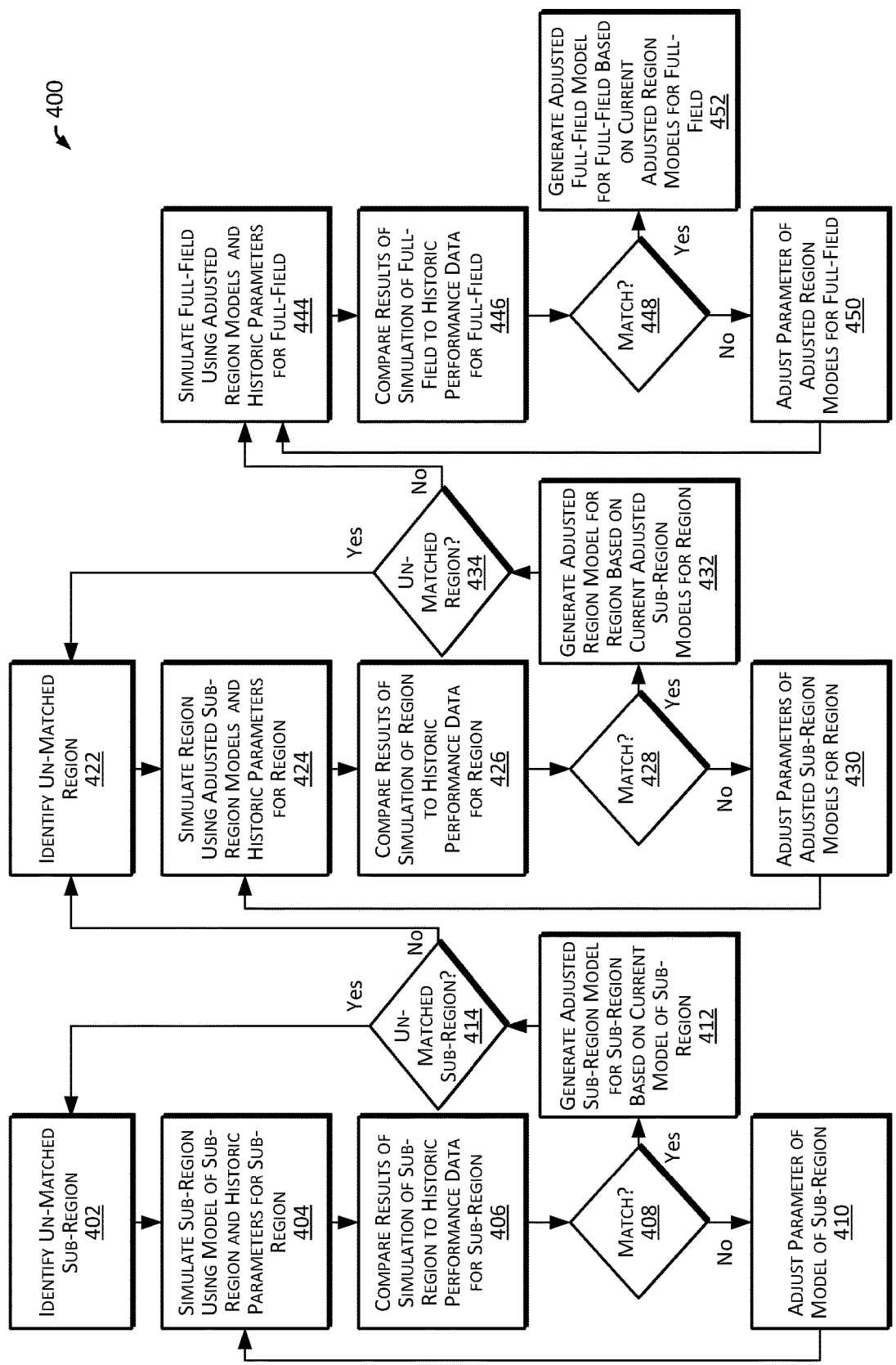
FIG. 4 is a flowchart that illustrates a method of iterative history matching of sub-regions, regions and a full-field to generate an adjusted full-field hydrocarbon reservoir model in accordance with one or more embodiments.

FIG. 4 is a flowchart that illustrates a method 400 of iterative history match based adjustment of sub-regions, regions and a full-field to generate an adjusted full-field hydrocarbon reservoir model in accordance with one or more embodiments. In some embodiments, method 400 includes identifying an un-matched sub-region (block 402) and conducting a history match based adjustment of the sub-region that includes the following: simulating the sub-region using a model of the sub-region and historic parameters for the sub-region (block 404), and comparing the results of the simulation to historic performance data for the sub-region (406) to determine if the sub-region model is a "match" to the historic performance of the sub-region (block 408). If the sub-region model is not a match, one or more parameters of the sub-region model is modified (or "adjusted") (block 410), and the cycle of history matching of the sub-region model is repeated (blocks 404-408). If the sub-region model is a match, an "adjusted" sub-region model is generated based on the current/matching sub-region model (block 412). Further, if it is determined that there is one or more sub-regions for which an "adjusted" sub-region model has not yet been generated (block 414), the cycle of determining an "adjusted" sub-region model (blocks 402-412) is repeated for a next sub-region for which an "adjusted" sub-region model has not yet been generated. A history match based adjustment of sub-regions may include, for example, in a first iteration of the determining of an "adjusted" sub-region model, identifying the first sub-region 220a, generating a simulation of the first sub-region 220a by applying a set of historic operational parameters for the sub-region 220a to a sub-region model 230 for the first sub-region 220a to generate corresponding simulated performance data for the sub-region 220a (e.g., applying observed operating pressures over a given year for wells located in the sub-region 220a to a sub-region model 230 having given values permeability for each of the cells 204 located in the sub-region 220a to generate a simulated production value for wells located in the sub-region 220a over a year), and comparing observed performance data corresponding to the historic operational parameters for the sub-region 220a to the simulated performance data for the sub-region 220a (e.g., comparing the observed production value for the wells located in the sub-region 220a over the given year to the simulated production value for wells located in the sub-region 220a over the year), and determining whether the simulated performance data for the sub-region 220a matches the observed performance data corresponding to the historic operational parameters for the sub-region 220a (e.g., determining whether the simulated production value for the sub-region 220a is within a specified percentage, such as 10%, of the observed production value for the sub-region 220a). In response to determining that the simulated performance data for the sub-region 220a does not match the observed performance data for the sub-region 220a, adjusting parameters of the sub-region model 230 by a given sub-region adjustment factor in an effort to correct the sub-region model 230, and repeating the cycle of history matching of the sub-region model 230 (e.g., in response to determining that the simulated production value for the sub-region 220a is less than 90% of the observed production value for the sub-region 220a, indicating that sub-region model 230 significantly underestimates production of the wells located in the sub-region 220a), increasing, in the parameters of the sub-region model 230, the values permeability for each of the cells 204 located in the sub-region 220a by a given factor, such as by +10%, in an effort to increase simulated production values generated by the sub-region model 230, and repeating history matching using the sub-region model 230 having the increased values of permeability). In response to determining that the simulated performance data for the sub-region 220a matches the observed performance data for the sub-region 220a, storing the sub-region model 230 as the "adjusted" sub-region model 250 for the sub-region 220a (e.g., in response determining that the simulated production value for the sub-region 220a is within 10% of the observed production value for the sub-region 220a using the sub-region model 230 having the increased values of permeability, which indicates that the sub-region model 230 accurately estimates production of the wells located in the sub-region 220a, storing the sub-region model 230 having the increased values of permeability as the "adjusted" sub-region model 250 for the sub-region 220a). Such a sub-region history matching operation may be repeated for each of the other sub-regions 220b-220g to generate an "adjusted" sub-region model 250 for each of the sub-regions 220a-220g.

In some embodiments, method 400 includes, in response to determining that the sub-regions are history matched (block 414), identifying an un-matched region (block 422), conducting a history match based adjustment of the region that includes the following: simulating the region using a model of the region and historic parameters for the region (block 424), and comparing the results of the simulation to historic performance data for the region (426) to determine if the region model is a "match" to the historic performance of the region (block 428). If the region model is not a match, one or more parameters of the region model is modified (or "adjusted") (block 430), and the cycle of history matching of the sub-region model is repeated (blocks 404-408). If the region model is a match, an "adjusted" region model is generated based on the current/matching region model (block 432). Further, if it is determined that there is one or more regions for which an "adjusted" region model has not yet been generated (block 434), the cycle of determining an "adjusted" region model (blocks 422-432) is repeated for a next region for which an "adjusted" region model has not yet been generated. A history match based adjustment of regions may include, for example, in a first iteration of the determining of an "adjusted" region model, identifying the first region 210a, generating a simulation of the first region 210a by applying a set of historic operational parameters for the region 210a to a region model 240 for the first region 210a to generate corresponding simulated performance data for the region 210a (e.g., by applying observed operating pressures over a given year for wells located in the region 210a to a region model 240 having given values permeability for each of the cells 204 located in the region 210a to generate a simulated production value for wells located in the region 210a over a year), and comparing observed performance data corresponding to the historic operational parameters for the region 210a to the simulated performance data for the region 210a (e.g., comparing the observed production value for the wells located in the region 210a over the given year to the simulated production value for wells located in the region 210a over the year), and determining whether the simulated performance data for the region 210a matches the observed performance data corresponding to the historic operational parameters for the region 210a (e.g., determining whether the simulated production value for the region 210a is within a specified percentage, such as 10%, of the observed production value for the region 210a). In response to determining that the simulated performance data for the region 210a does not match the observed performance data, adjusting parameters of the region model 240 by a given region adjustment factor in an effort to correct the region model 240, and repeating the cycle of history matching of the region model 240 (e.g., in response to determining that the simulated production value for the region 210a is less than 90% of the observed production value for the region 210a, indicating that region model 240 significantly underestimates production of the wells located in the region 210a, increasing, in the parameters of the region model 240, the values permeability for each of the cells 204 located in the region 210a by a given factor, such as by +10%, in an effort to increase simulated production values generated by the region model 240, and repeating history matching using the sub-region model 230 having the increased values of permeability). In response to determining that the simulated performance data for the region 210a matches the observed performance data for the region 210a, storing the region model 240 as the "adjusted" region model 260 for the region 210a (e.g., in response determining that the simulated production value for the region 210a is within 10% of the observed production value for the region 210a using the region model 240 having the increased values of permeability, which indicates that the region model 240 accurately estimates production of the wells located in the region 210a, storing the region model 240 having the increased values of permeability as the "adjusted" region model 260 for the region 210a). Such a region history matching operation may be repeated for the other region 210b to generate an "adjusted" region model 260 for each of the regions 210a and 210b.

In some embodiments, method 400 includes, in response to determining that the regions are history matched (block 434), conducting a history match based adjustment of the full-field that includes the following: simulating the full-field using a model of the full-field and historic parameters for the full-field (block 444), and comparing the results of the simulation to historic performance data for the full-field (446) to determine if the full-field model is a "match" to the historic performance of the full-field (block 448). If the full-field model is not a match, one or more parameters of the full-field model is modified (or "adjusted") (block 450) and the cycle of history matching of the full-field model is repeated (blocks 444-448). If the full-field model is a match, an "adjusted" full-field model is generated based on the current/matching full-field model (block 452). This may include, for example, generating a simulation of the full-field 202 by applying a set of historic operational parameters for the full-field 202 to a full-field model 270 for the full-field 202 to generate corresponding simulated performance data for the full-field 202 (e.g., observed operating pressures over a given year for wells located in the full-field 202 to a full-field model 270 having given values permeability for each of the cells 204 located in the full-field 202 to generate a simulated production value for wells located in the full-field 202 over a year), and comparing observed performance data corresponding to the historic operational parameters for the full-field 202 to the simulated performance data for the full-field 202 (e.g., comparing the observed production value for the wells located in the full-field 202 over the given year to the simulated production value for wells located in the full-field 202 over the year), and determining whether the simulated performance data for the full-field 202 matches the observed performance data corresponding to the historic operational parameters for the full-field 202 (e.g., determining whether the simulated production value for the full-field 202 is within a specified percentage, such as 10%, of the observed production value for the full-field 202). In response to determining that the simulated performance data for the full-field 202 does not match the observed performance data, adjusting parameters of the full-field model 270 by a given full-field adjustment factor in an effort to correct the full-field model 270, and repeating the cycle of history matching of the full-field model 270 (e.g., in response to determining that the simulated production value for the full-field 202 is less than 90% of the observed production value for the full-field 202, indicating that full-field model 270 significantly underestimates production of the wells located in the full-field 202, increasing, in the parameters of the full-field model 270, the values permeability for each of the cells 204 located in the full-field 202 by a given factor, such as by +10%, in an effort to increase simulated production values generated by the full-field model 270 and repeating history matching using the full-field model 270 having the increased values of permeability). In response to determining that the simulated performance data for the full-field 202 matches the observed performance data for the full-field 202, storing the full-field model 270 as the "adjusted" full-field model 280 for the full-field 202 (e.g., in response determining that the simulated production value for the full-field 202 is within 10% of the observed production value for the full-field 202, which indicates that the full-field model 270 accurately estimates production of the wells located in the full-field 202, storing the full-field model 270 having the increased values of permeability as the "adjusted" full-field model 280 for the full-field 202).

Referring again to FIG. 3, in some embodiments, the method 300 includes generating a simulation of the hydrocarbon reservoir based on the adjusted full-field model (block 310). Generating a simulation of the hydrocarbon reservoir based on the adjusted full-field model may include processing the adjusted full-field model using a set of input parameters to generate a corresponding simulation of the performance of the reservoir. For example, this may include the control system 110 applying a set of well operating parameters for wells 112 located in the full-field 202 (e.g., including well operating pressures and injection rates for wells 112 located in the full-field 202) to the adjusted full-field model 280 to generate a "multiscale sector" reservoir simulation 132 that estimates performance of the reservoir 102 over a period of time (e.g., including an estimate of production of the full-field 202 over the given period of time and the movement of fluids within the reservoir 102 over the given period of time).

In some embodiments, the method 300 includes developing the reservoir based on the simulation of the hydrocarbon reservoir (block 312). Developing the reservoir based on the simulation of the hydrocarbon reservoir may include defining or conducting various operations for development of the reservoir based on the simulation of the reservoir. For example, this may include the control system 110 or (another operator of the reservoir 102) determining drilling parameters or operating parameters for wells 112 in the reservoir 102 based on the "multiscale sector" reservoir simulation 132, or controlling drilling or operating of the wells 112 in accordance with the drilling or operating parameters. In some embodiments, a field development plan (FDP) may be generated for the reservoir 102 based on the on the simulation of the hydrocarbon reservoir. For example, the control system 110 or (another operator of the reservoir 102) may generate a FDP that specifies parameters for developing the reservoir 102, such as the drilling parameters or operating parameters for wells 112 in the reservoir 102, based on the on the estimate of production of the full-field 202 over the given period of time and the movement of fluids within the reservoir 102 over the given period of time provided by the "multiscale sector" reservoir simulation 132.

Figure 5:
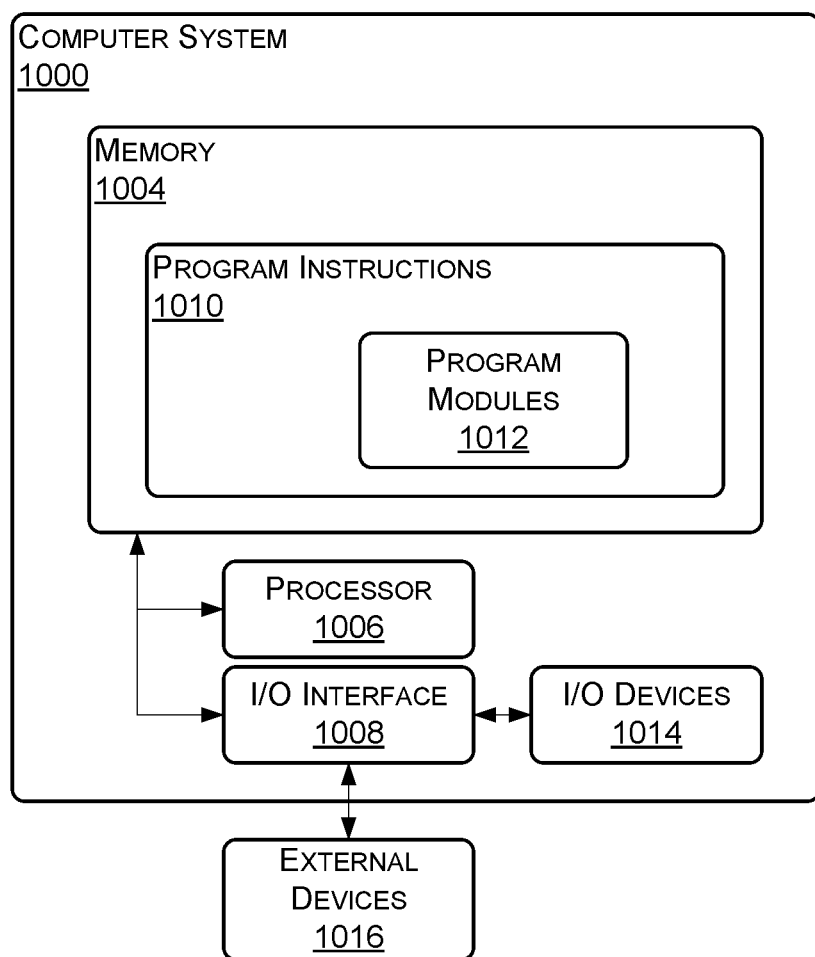
FIG. 5 is a diagram that illustrates an example computer system in accordance with one or more embodiments.

FIG. 5 is a diagram that illustrates an example computer system (or "system") 1000 in accordance with one or more embodiments. The system 1000 may include a memory 1004, a processor 1006 and an input/output (I/O) interface 1008. The memory 1004 may include non-volatile memory (e.g., flash memory, read-only memory (ROM), programmable read-only memory (PROM), erasable programmable read-only memory (EPROM), electrically erasable programmable read-only memory (EEPROM)), volatile memory (e.g., random access memory (RAM), static random access memory (SRAM), synchronous dynamic RAM (SDRAM)), or bulk storage memory (e.g., CD-ROM or DVD-ROM, hard drives). The memory 1004 may include a non-transitory computer-readable storage medium having program instructions 1010 stored on the medium. The program instructions 1010 may include program modules 1012 that are executable by a computer processor (e.g., the processor 1006) to cause the functional operations described, such as those described with regard to the control system 110 or the methods 300 and 400.

The processor 1006 may be any suitable processor capable of executing program instructions. The processor 1006 may include one or more processors that carry out program instructions (e.g., the program instructions of the program modules 1012) to perform the arithmetical, logical, or input/output operations described. The processor 1006 may include multiple processors that can be grouped into one or more processing cores that each include a group of one or more processors that are used for executing the processing described here, such as the independent parallel processing of partitions (or "sectors") by different processing cores to generate a simulation of a reservoir. The I/O interface 1008 may provide an interface for communication with one or more I/O devices 1014, such as a joystick, a computer mouse, a keyboard, or a display screen (e.g., an electronic display for displaying a graphical user interface (GUI)). The I/O devices 1014 may include one or more of the user input devices. The I/O devices 1014 may be connected to the I/O interface 1008 by way of a wired connection (e.g., an Industrial Ethernet connection) or a wireless connection (e.g., a Wi-Fi connection). The I/O interface 1008 may provide an interface for communication with one or more external devices 1016, such as sensors, valves, pumps, motors, computers or communication networks. In some embodiments, the I/O interface 1008 includes an antenna or a transceiver.

Further modifications and alternative embodiments of various aspects of the disclosure will be apparent to those skilled in the art in view of this description. Accordingly, this description is to be construed as illustrative only and is for the purpose of teaching those skilled in the art the general manner of carrying out the embodiments. It is to be understood that the forms of the embodiments shown and described here are to be taken as examples of embodiments. Elements and materials may be substituted for those illustrated and described here, parts and processes may be reversed or omitted, and certain features of the embodiments may be utilized independently, all as would be apparent to one skilled in the art after having the benefit of this description of the embodiments. Changes may be made in the elements described here without departing from the spirit and scope of the embodiments as described in the following claims. Headings used here are for organizational purposes only and are not meant to be used to limit the scope of the description.

It will be appreciated that the processes and methods described here are example embodiments of processes and methods that may be employed in accordance with the techniques described here. The processes and methods may be modified to facilitate variations of their implementation and use. The order of the processes and methods and the operations provided may be changed, and various elements may be added, reordered, combined, omitted, modified, and so forth. Portions of the processes and methods may be implemented in software, hardware, or a combination thereof. Some or all of the portions of the processes and methods may be implemented by one or more of the processors/modules/applications described here.

As used throughout this application, the word "may" is used in a permissive sense (meaning having the potential to), rather than the mandatory sense (meaning must). The words "include," "including," and "includes" mean including, but not limited to. As used throughout this application, the singular forms "a," "an," and "the" include plural referents unless the content clearly indicates otherwise. Thus, for example, reference to "an element" may include a combination of two or more elements. As used throughout this application, the term "or" is used in an inclusive sense, unless indicated otherwise. That is, a description of an element including A or B may refer to the element including one or both of A and B. As used throughout this application, the phrase "based on" does not limit the associated operation to being solely based on a particular item. Thus, for example, processing "based on" data A may include processing based at least in part on data A and based at least in part on data B, unless the content clearly indicates otherwise. As used throughout this application, the term "from" does not limit the associated operation to being directly from. Thus, for example, receiving an item "from" an entity may include receiving an item directly from the entity or indirectly from the entity (e.g., by way of an intermediary entity). Unless specifically stated otherwise, as apparent from the discussion, it is appreciated that throughout this specification discussions utilizing terms such as "processing," "computing," "calculating," "determining," or the like refer to actions or processes of a specific apparatus, such as a special purpose computer or a similar special purpose electronic processing/computing device. In the context of this specification, a special purpose computer or a similar special purpose electronic processing/computing device is capable of manipulating or transforming signals, typically represented as physical, electronic or magnetic quantities within memories, registers, or other information storage devices, transmission devices, or display devices of the special purpose computer or similar special purpose electronic processing/computing device.

What is claimed is:

1. A method of developing a hydrocarbon reservoir, the method comprising:
   determining a full-field reservoir model of a hydrocarbon reservoir, the full-field reservoir model comprising a plurality of cells that represent a full-field of the hydrocarbon reservoir;
   determining regions of the full-field reservoir model, wherein determining the regions of the full-field reservoir model comprises segmenting the full-field reservoir model into the regions based on shared characteristics of the portions of the reservoir corresponding to the regions, wherein the characteristics comprise pore-volume;
   determining, for each of the regions of the full-field reservoir model, sub-regions of each of the regions;
   generating, based on iterative history match based adjustment of the sub-regions, the regions of the full-field reservoir model, and the full-field of the hydrocarbon reservoir, an adjusted full-field model of the hydrocarbon reservoir, the generating of the adjusted full-field model of the hydrocarbon reservoir comprising:
      for each sub-region, determining an adjusted sub-region model, the determining of the adjusted sub-region model for each sub-region comprising adjusting parameters of a sub-region model for the sub-region to history match the sub-region model to historic data for the sub-region;
      for each region of the full-field reservoir model, determining an adjusted region model, the determining of the adjusted region model for each region comprising adjusting parameters of a region model for the region to history match the region model for the region to historic data for the region, the region model for the region comprising the adjusted sub-region models of the sub-regions within the region;
      for the full-field of the hydrocarbon reservoir, determining an adjusted full-field model, the determining of the adjusted full-field model for the full-field comprising adjusting parameters of a full-field model for the full-field to history match the full-field model for the full-field to historic parameters for the full-field, the full-field model for the full-field comprising the adjusted region models of the regions of the full-field reservoir model; and
   generating, using the adjusted full-field model, a simulation of the hydrocarbon reservoir, wherein determining the regions of the full-field reservoir model comprises verifying the regions of the full-field reservoir model, the verifying comprising:
      conducting, using the full-field reservoir model of the hydrocarbon reservoir, a simulation of the hydrocarbon reservoir to determine full-field fluid fluxes for the regions;
      for each of the regions:
         conducting, using the region model for the region, a simulation of the region to determine region fluid fluxes for the region; and
         comparing the region fluid fluxes for the region to the full-field fluid fluxes for the region to verify the region fluid fluxes for the region.

2. The method of claim 1, wherein determining sub-regions of each of the regions of the full-field reservoir model comprises segmenting the region into sub-regions based on shared characteristics of the portions of the reservoir corresponding to the sub-regions.

3. The method of claim 2, wherein the characteristics comprise well mismatch, well density or grid size.

4. The method of claim 1,
   wherein adjusting parameters of the sub-region model for a sub-region to history match the sub-region model to historic data for the sub-region comprises adjusting a permeability of the sub-region model for the sub-region to match an output of the sub-region model for the sub-region to observed performance data for the sub-region,
   wherein adjusting parameters of the region model for a region to history match the region model for the region to historic data for the region comprises adjusting permeability of the adjusted sub-region models of the sub-regions within the region to match an output of the adjusted sub-region models of the sub-regions within the region to observed performance data for the region, and
   wherein adjusting parameters of a full-field model for the full-field to history match the full-field model for the full-field to historic parameters for the full-field comprises adjusting permeability of the adjusted region models of the regions within the full-field to match an output of the adjusted region models of the regions within the full-field to observed performance data for the full-field.

5. The method of claim 4,
   wherein adjusting permeability of the adjusted sub-region models of the sub-regions within a region comprises adjusting the permeabilities of the adjusted sub-region models of the sub-regions within the region by a given region factor, and
   wherein adjusting permeability of the adjusted region models of the regions within the full-field comprises adjusting the permeabilities of the adjusted region models of the regions within the full-field by a given full-field factor.

6. The method of claim 1, further comprising generating a field development plan (FDP) for the hydrocarbon reservoir based on the simulation of the hydrocarbon reservoir.

7. The method of claim 1, further comprising:
   identifying well drilling parameters based on the simulation of the hydrocarbon reservoir; and
   drilling a well in the hydrocarbon reservoir based on the well drilling parameters.

8. The method of claim 1, further comprising:
   identifying well operating parameters based on the simulation of the hydrocarbon reservoir; and operating a well in the hydrocarbon reservoir based on the well operating parameters.

9. A non-transitory computer readable storage medium comprising program instructions stored thereon that are executable by a processor to perform the following operations for developing a hydrocarbon reservoir:
   determining a full-field reservoir model of a hydrocarbon reservoir, the full-field reservoir model comprising a plurality of cells that represent a full-field of the hydrocarbon reservoir;
   determining regions of the full-field reservoir model, wherein determining the regions of the full-field reservoir model comprises segmenting the full-field reservoir model into the regions based on shared characteristics of the portions of the reservoir corresponding to the regions, wherein the characteristics comprise pore-volume;
   determining, for each of the regions of the full-field reservoir model, sub-regions of each of the regions;
   generating, based on iterative history match based adjustment of the sub-regions, the regions of the full-field reservoir model, and the full-field of the hydrocarbon reservoir, an adjusted full-field model of the hydrocarbon reservoir, the generating of the adjusted full-field model of the hydrocarbon reservoir comprising:
      for each sub-region, determining an adjusted sub-region model, the determining of the adjusted sub-region model for each sub-region comprising adjusting parameters of a sub-region model for the sub-region to history match the sub-region model to historic data for the sub-region;
      for each region of the full-field reservoir model, determining an adjusted region model, the determining of the adjusted region model for each region comprising adjusting parameters of a region model for the region to history match the region model for the region to historic data for the region, the region model for the region comprising the adjusted sub-region models of the sub-regions within the region;
      for the full-field of they hydrocarbon reservoir, determining an adjusted full-field model, the determining of the adjusted full-field model for the full-field comprising adjusting parameters of a full-field model for the full-field to history match the full-field model for the full-field to historic parameters for the full-field, the full-field model for the full-field comprising the adjusted region models of the regions of the full-field reservoir model; and
   generating, using the adjusted full-field model, a simulation of the hydrocarbon reservoir, wherein determining the regions of the full-field reservoir model comprises verifying the regions of the full-field reservoir model, the verifying comprising:
      conducting, using the full-field reservoir model of the hydrocarbon reservoir, a simulation of the hydrocarbon reservoir to determine full-field fluid fluxes for the regions;
      for each of the regions:
         conducting, using the region model for the region, a simulation of the region to determine region fluid fluxes for the region; and
         comparing the region fluid fluxes for the region to the full-field fluid fluxes for the region to verify the region fluid fluxes for the region.

10. The medium of claim 9, wherein determining sub-regions of a each of the regions of the full-field reservoir model comprises segmenting the region into sub-regions based on shared characteristics of the portions of the reservoir corresponding to the sub-regions.

11. The medium of claim 10, wherein the characteristics comprise well mismatch, well density or grid size.

12. The medium of claim 9,
   wherein adjusting parameters of the sub-region model for a sub-region to history match the sub-region model to historic data for the sub-region comprises adjusting a permeability of the sub-region model for the sub-region to match an output of the sub-region model for the sub-region to observed performance data for the sub-region,
   wherein adjusting parameters of the region model for a region to history match the region model for the region to historic data for the region comprises adjusting permeability of the adjusted sub-region models of the sub-regions within the region to match an output of the adjusted sub-region models of the sub-regions within the region to observed performance data for the region, and
   wherein adjusting parameters of a full-field model for the full-field to history match the full-field model for the full-field to historic parameters for the full-field comprises adjusting permeability of the adjusted region models of the regions within the full-field to match an output of the adjusted region models of the regions within the full-field to observed performance data for the full-field.

13. The medium of claim 12,
   wherein adjusting permeability of the adjusted sub-region models of the sub-regions within a region comprises adjusting the permeabilities of the adjusted sub-region models of the sub-regions within the region by a given region factor, and
   wherein adjusting permeability of the adjusted region models of the regions within the full-field comprises adjusting the permeabilities of the adjusted region models of the regions within the full-field by a given full-field factor.

14. The medium of claim 9, further comprising generating a field development plan (FDP) for the hydrocarbon reservoir based on the simulation of the hydrocarbon reservoir.

15. The medium of claim 9, further comprising:
   identifying well drilling parameters based on the simulation of the hydrocarbon reservoir; and
   drilling a well in the hydrocarbon reservoir based on the well drilling parameters.

16. The medium of claim 9, further comprising:
   identifying well operating parameters based on the simulation of the hydrocarbon reservoir; and
   operating a well in the hydrocarbon reservoir based on the well operating parameters.

17. A hydrocarbon reservoir development system comprising:
   a hydrocarbon reservoir control system comprising non-transitory computer readable storage medium comprising program instructions stored thereon that are executable by a processor to perform the following operations for developing a hydrocarbon reservoir:
   determining a full-field reservoir model of a hydrocarbon reservoir, the full-field reservoir model comprising a plurality of cells that represent a full-field of the hydrocarbon reservoir;
   determining regions of the full-field reservoir model, wherein determining the regions of the full-field reservoir model comprises segmenting the full-field reservoir model into the regions based on shared characteristics of the portions of the reservoir corresponding to the regions, wherein the characteristics comprise pore-volume;

determining, for each of the regions of the full-field reservoir model, sub-regions of the region;

determining, for each of the regions, sub-regions of each of the regions;

generating, based on iterative history match based adjustment of the sub-regions, the regions of the full-field reservoir model, and the full-field of the hydrocarbon reservoir, an adjusted full-field model of the hydrocarbon reservoir, the generating of the adjusted full-field model of the hydrocarbon reservoir comprising:

for each sub-region, determining an adjusted sub-region model, the determining of the adjusted sub-region model for each sub-region comprising adjusting parameters of a sub-region model for the sub-region to history match the sub-region model to historic data for the sub-region;

for each region of the full-field reservoir model, determining an adjusted region model, the determining of the adjusted region model for each region comprising adjusting parameters of a region model for the region to history match the region model for the region to historic data for the region, the region model for the region comprising the adjusted sub-region models of the sub-regions within the region;

for the full-field of the hydrocarbon reservoir, determining an adjusted full-field model, the determining of the adjusted full-field model for the full-field comprising adjusting parameters of a full-field model for the full-field to history match the full-field model for the full-field to historic parameters for the full-field, the full-field model for the full-field comprising the adjusted region models of the regions of the full-field reservoir model; and generating, using the adjusted full-field model, a simulation of the hydrocarbon reservoir, wherein determining the regions of the full-field reservoir model comprises verifying the regions of the full-field reservoir model, the verifying comprising:

conducting, using the full-field reservoir model of the hydrocarbon reservoir, a simulation of the hydrocarbon reservoir to determine full-field fluid fluxes for the regions;

for each of the regions:

conducting, using the region model for the region, a simulation of the region to determine region fluid fluxes for the region; and comparing the region fluid fluxes for the region to the full-field fluid fluxes for the region to verify the region fluid fluxes for the region.

18. The system of claim 17, wherein determining sub-regions of each of the regions of the full-field reservoir model comprises segmenting the region into sub-regions based on shared characteristics of the portions of the reservoir corresponding to the sub-regions.

19. The system of claim 18, wherein the characteristics comprise well mismatch, well density or grid size.

20. The system of claim 17, wherein adjusting parameters of the sub-region model for a sub-region to history match the sub-region model to historic data for the sub-region comprises adjusting a permeability of the sub-region model for the sub-region to match an output of the sub-region model for the sub-region to observed performance data for the sub-region, wherein adjusting parameters of the region model for a region to history match the region model for the region to historic data for the region comprises adjusting permeability of the adjusted sub-region models of the sub-regions within the region to match an output of the adjusted sub-region models of the sub-regions within the region to observed performance data for the region, and wherein adjusting parameters of a full-field model for the full-field to history match the full-field model for the full-field to historic parameters for the full-field comprises adjusting permeability of the adjusted region models of the regions within the full-field to match an output of the adjusted region models of the regions within the full-field to observed performance data for the full-field.

21. The system of claim 20, wherein adjusting permeability of the adjusted sub-region models of the sub-regions within a region comprises adjusting the permeabilities of the adjusted sub-region models of the sub-regions within the region by a given region factor, and wherein adjusting permeability of the adjusted region models of the regions within the full-field comprises adjusting the permeabilities of the adjusted region models of the regions within the full-field by a given full-field factor.

22. The system of claim 17, further comprising generating a field development plan (FDP) for the hydrocarbon reservoir based on the simulation of the hydrocarbon reservoir.

23. The system of claim 17, further comprising:

identifying well drilling parameters based on the simulation of the hydrocarbon reservoir; and drilling a well in the hydrocarbon reservoir based on the well drilling parameters.

24. The system of claim 17, further comprising:

identifying well operating parameters based on the simulation of the hydrocarbon reservoir; and operating a well in the hydrocarbon reservoir based on the well operating parameters.

* * * * *

UNITED STATES PATENT AND TRADEMARK OFFICE
CERTIFICATE OF CORRECTION

PATENT NO. : 11,680,465 B2
APPLICATION NO. : 16/725115
DATED : June 20, 2023
INVENTOR(S) : Ali Abdulrahman Albinali Page 1 of 1

It is certified that error appears in the above-identified patent and that said Letters Patent is hereby corrected as shown below:

In the Claims

Column 25, Claim 10, Line 2:
-a each-
Should be changed to:
--each--.

Signed and Sealed this
Twenty-fifth Day of July, 2023

*Katherine Kelly Vidal*

Katherine Kelly Vidal
*Director of the United States Patent and Trademark Office*